(12) United States Patent
Gupta et al.

(10) Patent No.: US 10,878,860 B1
(45) Date of Patent: Dec. 29, 2020

(54) MULTI-LEVEL SIGNALING SCHEME FOR MEMORY INTERFACE

(71) Applicant: SANDISK TECHNOLOGIES LLC, Addison, TX (US)

(72) Inventors: Nitin Gupta, Bangalore (IN); Shiv Harit Mathur, Bangalore (IN); Ramakrishnan Subramanian, Bangalore (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/728,451

(22) Filed: Dec. 27, 2019

(51) Int. Cl.
*G11C 7/12* (2006.01)
*G11C 7/22* (2006.01)
*G11C 7/10* (2006.01)

(52) U.S. Cl.
CPC .............. *G11C 7/12* (2013.01); *G11C 7/1045* (2013.01); *G11C 7/1051* (2013.01); *G11C 7/1078* (2013.01); *G11C 7/22* (2013.01)

(58) Field of Classification Search
CPC ......... G11C 7/10; G11C 7/12; G11C 2207/07; G11C 7/1027
See application file for complete search history.

(56) References Cited

U.S. PATENT DOCUMENTS

2017/0212695 A1\* 7/2017 Hollis ................. G06F 13/4282
2019/0158320 A1\* 5/2019 Kwon ................. G11C 7/1057

\* cited by examiner

*Primary Examiner* — Han Yang
(74) *Attorney, Agent, or Firm* — Morgan, Lewis & Bockius LLP

(57) ABSTRACT

A data storage system includes a memory including a plurality of memory cells; and an interface coupled to the memory and a host. The interface includes a multi-level transmission encoder configured to receive an input data signal from the host and encode the input data signal as a multi-level data signal. The interface further includes a multi-stage driver network including a plurality of driver stages, wherein each driver stage of the plurality of driver stages is configured to apply an impedance or forego applying an impedance to the multi-level data signal based on a previous state and a current state of the multi-level data signal.

20 Claims, 7 Drawing Sheets

MULTI-LEVEL SIGNALING SCHEME FOR MEMORY INTERFACE

TECHNICAL FIELD

The present disclosure relates to memory systems, and in particular, to a multi-level signaling scheme at a memory interface.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices. However, a drawback of increasing capacity is that the interface links between various storage components are increasingly loaded, making them prone to limitations in performance due to capacitance, power, and noise limitations.

SUMMARY

This application describes various implementations of an interface link, disposed between various storage components, which supports improved performance while accounting for the capacitance, power, and noise limitations which usually accompany speed increases. Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface link while accounting for capacitance (or loading), power, and noise limitations.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
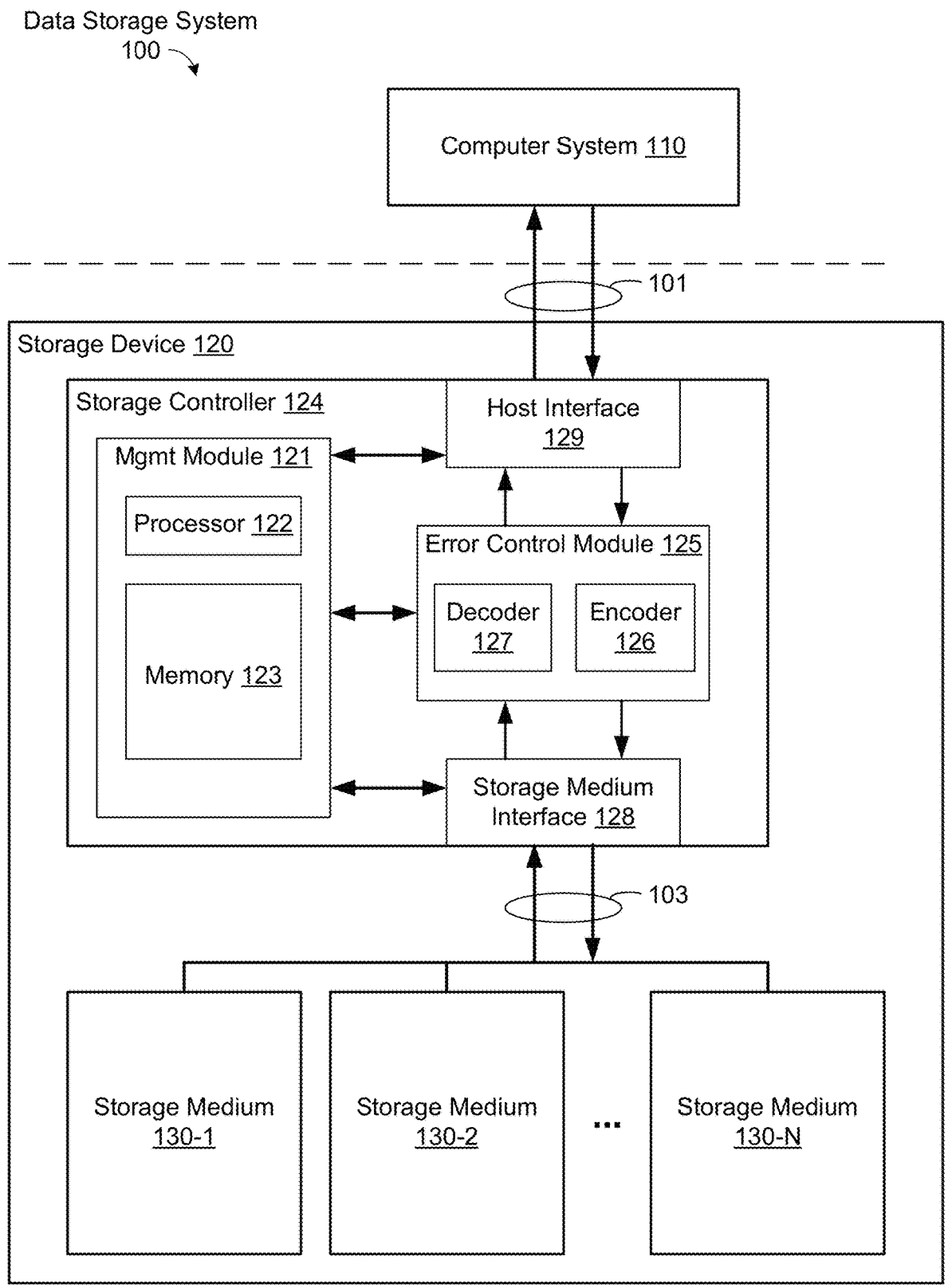
FIG. 1 is a block diagram of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that transmit data from a host to a storage system through an interface link optimized for performance.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein.

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage system 100 includes data processing system (alternatively referred to herein as a computer system or host) 110, and storage device 120.

Computer system 110 is coupled to storage device 120 through data connections 101. In various implementations, computer system 110 includes storage device 120 as a component. Generally, computer system 110 includes any suitable computer device, such as a computer, a laptop computer, a tablet device, a netbook, an internet kiosk, a personal digital assistant, a mobile phone, a smart phone, a gaming device, a computer server, a peripheral component interconnect (PCI), a serial AT attachment (SATA), or any other computing device. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage device 120 includes one or more storage mediums 130 coupled to storage controller 124 through data connections 103. In various implementations, storage controller 124 and storage medium(s) 130 are included in the same device (e.g., storage device 120) as constituent components thereof, while in other embodiments, storage controller 124 and storage medium(s) 130 are, or are in, separate devices. In some embodiments, storage controller 124 is an application-specific integrated circuit (ASIC). Each storage medium 130 includes any number (i.e., one or more) of memory devices including, without limitation, non-volatile semiconductor memory devices, such as flash memory. For example, flash memory devices can be configured for enterprise storage suitable for applications such as cloud computing. Additionally or alternatively, flash memory devices can also be configured for relatively smaller-scale applications such as personal flash drives or hard-disk replacements for personal, laptop and tablet computers. In some implementations, a storage medium 130 comprises one or more flash memory devices. In some implementations, a storage medium 130 comprises at least one of NAND-type flash memory and/or NOR-type flash memory.

Storage mediums are often divided into a number of addressable and individually selectable blocks, referred to herein as selectable portions. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those ranges may be extended upward or downward, and/or shrink or expand depending on a particular application. In some embodiments, each page stores one or more codewords, where a codeword is the smallest unit of data that is separately encoded and decoded by the encoder and decoder mechanisms of a particular device.

In some implementations, storage controller 124 includes management module 121, error control module 125, storage medium interface (I/O) 128 and host interface 129. Host interface 129 couples storage device 120 and its storage controller 124 to one or more computer systems 110, while storage medium interface 128 couples storage controller 124 to storage medium(s) 130. In some implementations, storage controller 124 includes various additional features that have not been illustrated for the sake of brevity, and so as not to obscure more pertinent features of the example implementations disclosed herein, and that a different arrangement of features may be possible.

Host interface 129 typically includes data buffers (not shown) to buffer data being received and transmitted by storage device 120, via data connections 101. Similarly, storage medium I/O 128 provides an interface to storage medium(s) 130 though data connections 103. In some implementations, storage medium interface 128 includes read and write circuitry.

In some implementations, management module 121 includes one or more processors 122. However, in some implementations, processor 122 is shared by one or more components within, and in some cases, beyond the function of storage controller 124. Management module 121 is coupled to host interface 129, error control module 125 and storage medium I/O 128 in order to coordinate the operation of these components.

Error control module 125 is coupled between storage medium I/O 128 and host interface 129. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in a storage medium 130. When the encoded data is read from the storage medium 130, decoder 127 applies a decoding process to recover the data, and correct errors within the error correcting capability of the error control code. Various error control codes have different error detection and correction capacities, and particular codes are selected for various applications.

Management module 121 typically includes one or more processors 122 (sometimes referred to herein as CPUs, processing units, hardware processors, processors, microprocessors or microcontrollers) for executing modules, programs and/or instructions stored in memory and thereby performing processing operations. Management module 121 also includes memory 123 (sometimes referred to herein as controller memory), and one or more communication buses for interconnecting these components. Communication buses optionally include circuitry (sometimes called a chipset) that interconnects and controls communications between system components. Management module 121 is coupled by communication buses to storage medium interface 128, error control module 125, and host interface 129. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application corresponds to sets of instructions for performing the corresponding functions. These sets of instructions (i.e., modules or programs) need not be implemented as separate software programs, procedures or modules, and thus various subsets of these modules may be combined or otherwise re-arranged in various embodiments. In some embodiments, memory 123 may store a subset of modules and data structures. Furthermore, memory 123 may store additional modules and data structures. In some embodiments, the programs, modules, and data structures stored in memory 123, or the non-transitory computer readable storage medium of memory 123, provide instructions for implementing any of the methods described below. Stated another way, the programs or modules stored in memory 123, when executed by the one or more processors 122, cause storage device 120 to perform any of the operations described below. Although FIG. 1 shows various modules, FIG. 1 is intended more as functional description of the various features which may be present in the modules than as a structural schematic of the embodiments described herein. In practice, the programs, modules, and data structures shown separately could be combined, and some programs, modules, and data structures could be separated.

The inventive concepts described below are directed to an improved method of communicating data (referred to as "signaling") at an interface between a host (e.g., computer system 110 as described above) and a memory (e.g., storage medium 130 as described above, such as a NAND flash device). The inventive concepts described below are also directed to an improved interface which is configured to execute the improved method. For example, the interface as described herein corresponds to interface 128 in FIG. 1. However, the concepts described below apply equally to any interface disposed between a host (e.g., 110) and a storage medium (e.g., 130, also referred to herein as memory, memory device, and storage device), regardless of the specific architecture of the component modules.

As performance increases at the host and the memory, the interface between them tends to be a bottleneck. Pin capacitance, power, and noise limitations introduce performance constraints at the interface. As a result, signaling performance at the interface tends to be limited compared to performance of the host and memory, which slows down the whole storage system. Embodiments of the interface described herein implement an improved signaling approach which results in higher performance while accounting for capacitance, power, and noise issues.

Figure 2:
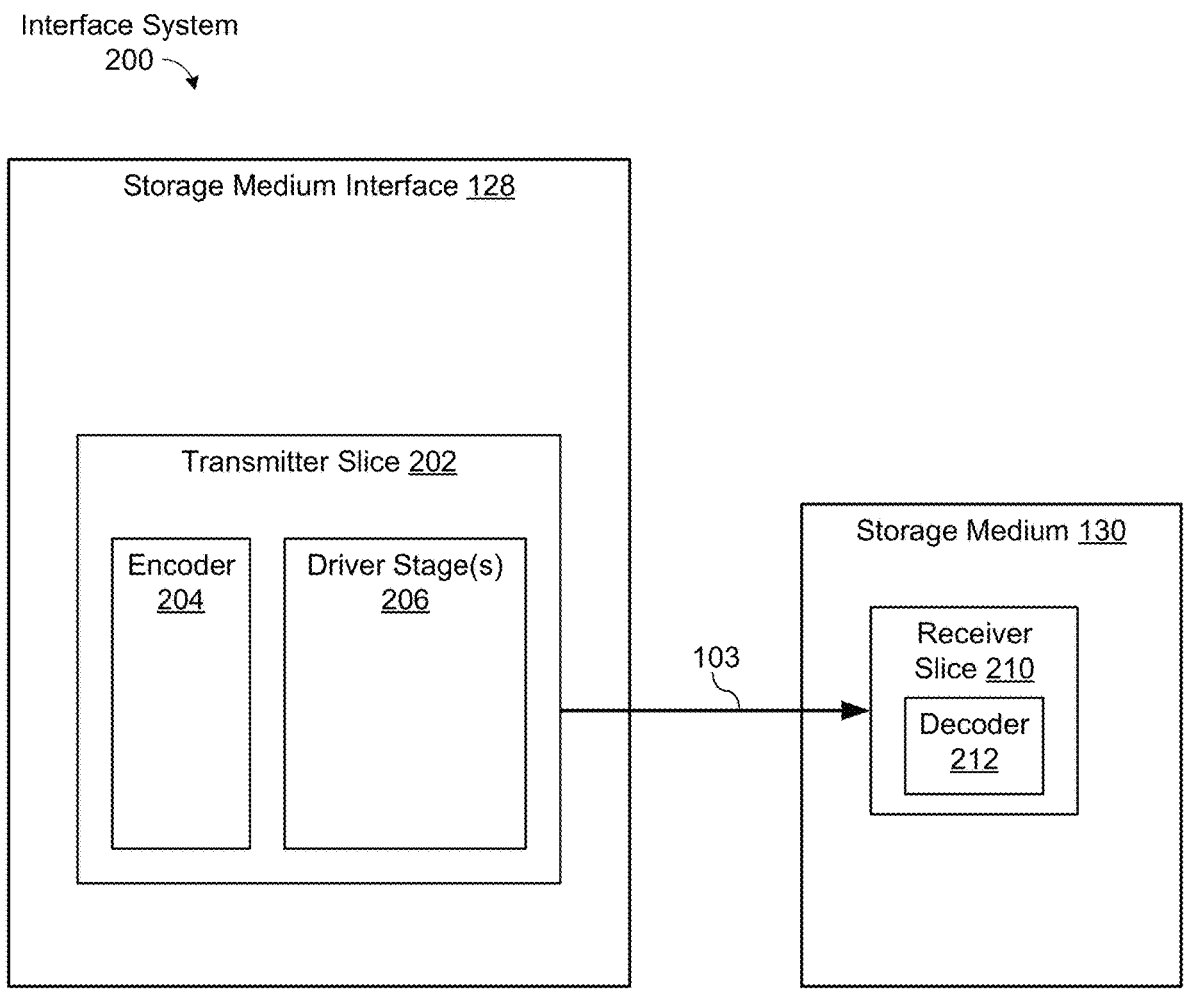
FIG. 2 is a block diagram of an interface system in accordance with some embodiments.

FIG. 2 is a block diagram of an interface system 200 in accordance with some embodiments. In some embodiments, the storage medium interface 128, as described with reference to FIG. 1 above, includes a transmitter comprising a slice 202 for every bit of data in a word to be written to memory (e.g., the storage medium 130). Each transmitter slice 202 includes an encoder 204 and one or more driver stages 206. The transmitter (including the encoder and driver stages) may be implemented as a single transmitter (with a single encoder and driver stage(s)) or as independent slices (each with its own encoder and driver stage(s)). For example, if the interface 128 signals data at the word level over channel 103 to storage medium 130, the transmitter includes 8 slices 202 (one for each bit of the word), responsible for encoding the bits of the word in parallel and transmitting the encoded word to the storage medium 130.

In some embodiments, the storage medium 130 includes a receiver comprising a slice 210 for every bit of data in the word to be written to memory. The receiver may be implemented as a single receiver or as independent receiver slices. For example, if the interface 128 signals data at the word level over channel 103 to storage medium 130, the receiver includes 8 slices 210 (one for each bit of the word), responsible for decoding the bits of the word in parallel and directing each bit to a selectable portion of the storage medium for storage.

Embodiments of the interface 128 described herein implement an improved signaling approach by encoding (e.g., using encoder 204) the data to be written into a multi-level signal (MLS), impedance matching the data (e.g., using driver stage(s) 206), and signaling the data over channel 103 to a particular storage medium 130 for storage.

Figure 3A:
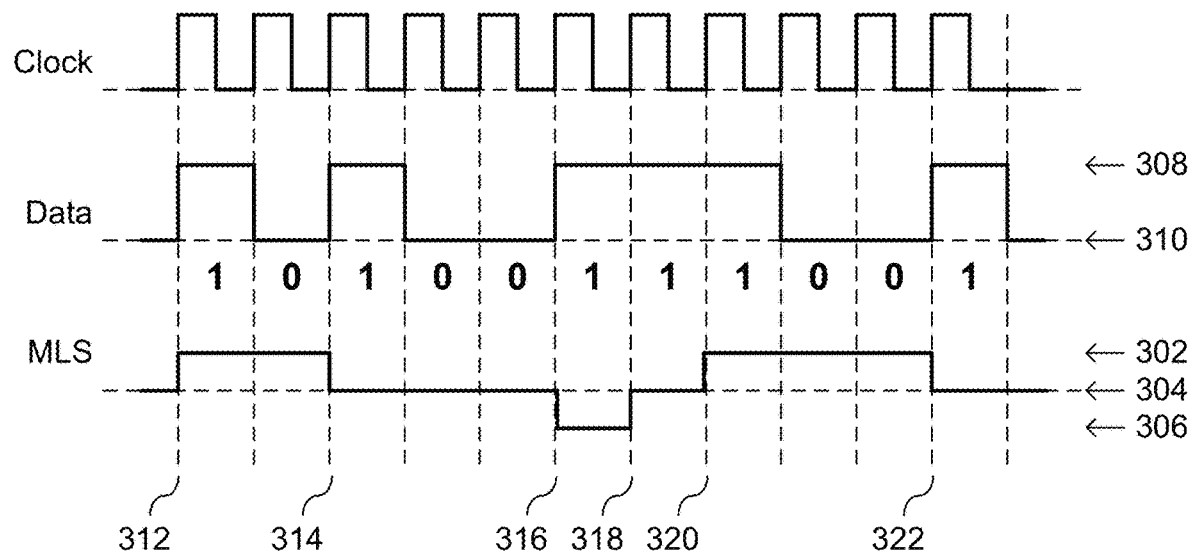
FIGS. 3A-3B are diagrams depicting an example multi-level signaling scheme in accordance with some embodiments.

FIG. 3A depicts an example multi-level signal (MLS) scheme in accordance with some embodiments. The example MLS depicted in the figure uses three signaling levels for transmission of data bits: a high level 302, medium level 304, and low level 306. In some embodiments, the high level is referred to as logic +1, the medium level as logic 0, and the low level as logic −1. The MLS cycles sequentially through the three levels at a fixed pattern. In some embodiments, the pattern is 0, +1, 0, −1, and so forth. Stated another way, a full cycle of the sequence is middle-to-high, high-to-middle, middle-to-low, and low-to-middle. Other patterns may be implemented, and signaling schemes using more than three levels may be implemented without departing from the scope of the inventive concepts described herein.

Regardless of the pattern or number of letters, the MLS encodes the underlying data signal by either transitioning or not transitioning. In some embodiments, an MLS transition represents a 1 bit in the underlying data signal, and a non-transition represents a 0 bit. FIG. 3A depicts this example. At time 312, the underlying data signal is logic 1. As such, the MLS transitions to the next state in the sequence (middle-to-high). The next bit in the data signal is logic 0. As such, the MLS does not transition, instead maintaining its current state (high). At times 314, 316, 318, 320, and 322, the binary data signal includes more 1 bits; as such, the MLS transitions to the next state in the sequence at those times. For the 0 bits, the MLS does not transition, instead maintaining its current state. Other transition schemes, such as transitioning to indicate a 0 bit and not transitioning to indicate a 1 bit, may be implemented without departing from the scope of the inventive concepts described herein.

The MLS reduces signal swing by ½, as this is required to give three levels in the voltage band. Referring to FIG. 3A, if voltage levels 308 and 310 (representing 1 and 0, respectively) are +1V and 0V, then voltage levels 302, 304, and 306 (representing +1, 0, and −1, respectively) are 0.5V, 0V, and −0.5V. Alternatively, voltage levels 302, 304, and 306 are 1.0V, 0.5V, and 0V, respectively. Alternatively, voltage levels 302, 304, and 306 are 0.75V, 0.5V, and 0.25V, respectively. Other voltage levels may be implemented without departing from the scope of the inventive concepts described herein, as long as the voltage swing of the MLS signal is equal to or less than that of the data signal. By using this scheme, the average current to charge a load reduces by ½. Thus, in a given power budget, the performance is increased by 2×.

Figure 3B:
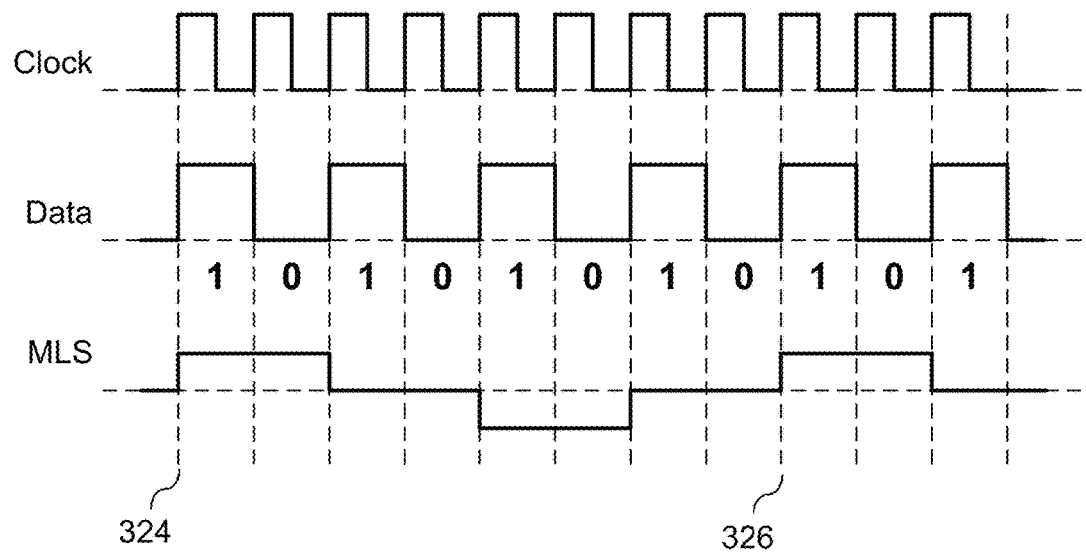

Compared to the frequency of the underlying data signal, the fundamental frequency of the MLS is reduced by ¼. Referring to FIG. 3B, an example data signal switches at every rising clock edge. This example signal represents the fastest frequency for a binary data signal, with a single cycle (1, 0) spanning two clock pulses. Referring to the corresponding MLS, a single cycle (+1, 0, −1, 0) spans eight clock pulses (between times 324 and 326). By using this scheme, the fundamental frequency is reduced by ¼ of the baud rate. Thus, the self-generated supply noise component (which is influenced by frequency of the signal) is drastically reduced giving an advantage in signal quality. This approach eases the requirement of on-die-capacitance (ODC).

In some embodiments, the MLS pattern begins at the middle level 304. This reduces power, and the first switching transition for 4 data bits is designated as middle-to-high, while the other four data bits can be designated as middle-to-low, thus reducing the peak switching current on the power supply. Stated another way, by starting at 0 (e.g., 0.5*VDDO), which is a stable state, it is relatively easy to transition from 0 to +1 and +1 to 0. As such, starting with 0 further reduces power and switching noise.

Figure 4:
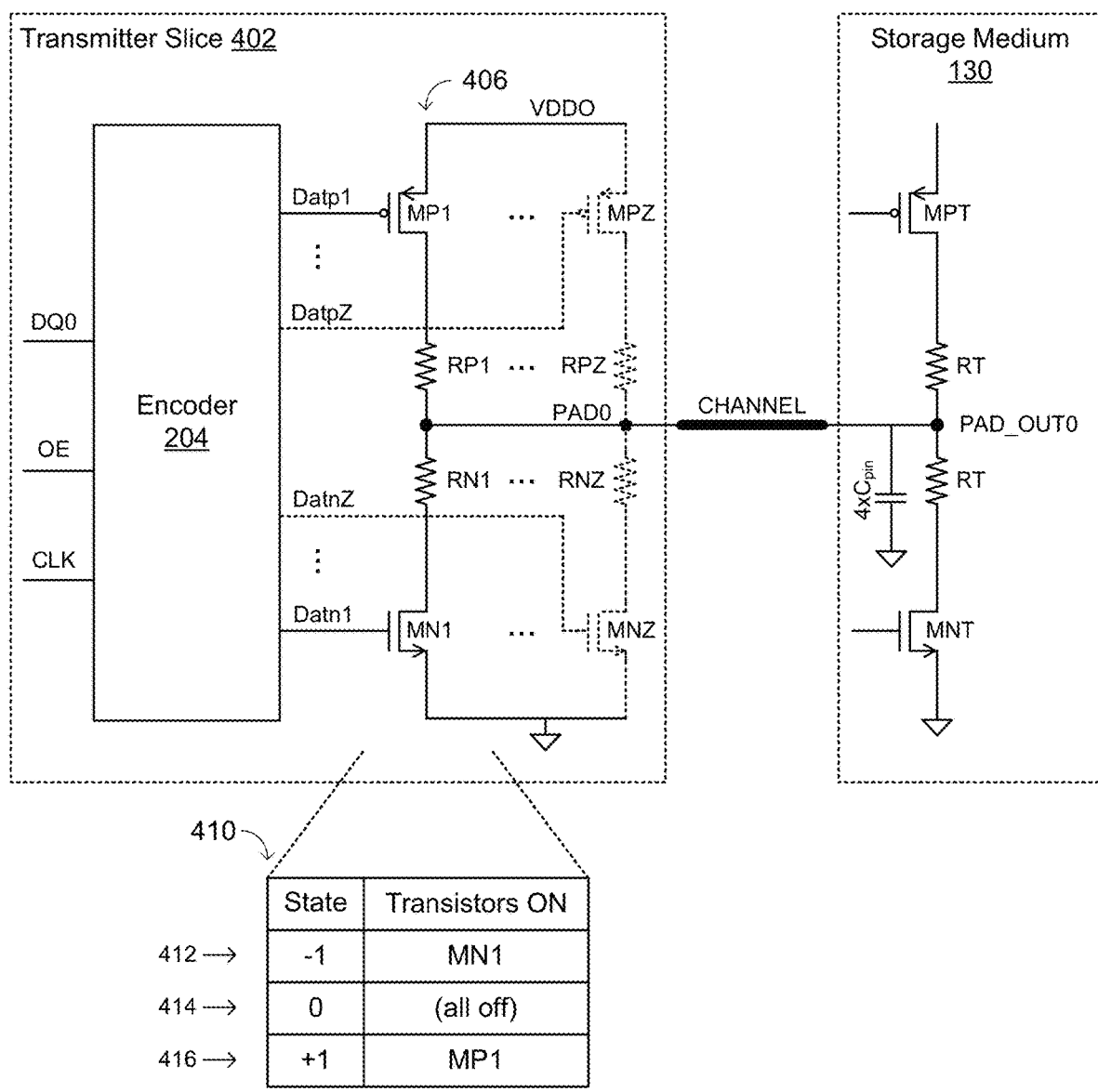
FIG. 4 is a block diagram of a transmitter slice of an interface system in accordance with some embodiments.

FIG. 4 block diagram of an example transmitter slice 402 of an interface system 400 in accordance with some embodiments. The transmitter slice 402 includes an encoder 204 for encoding data received from the host for storage in a storage medium 130. This particular transmitter slice operates on the first bit (designated as DQ0) of each word of data (i.e., DQ0 through DQ7) received from the host. In some embodiments, the encoder 204 also includes a control input (designated as OE) for turning the encoder on and off, and a clock signal (designated as CLK). While the example MLS scheme in FIGS. 3A-3B depicts a single data rate example (i.e., data is sampled at the rising edge of each clock pulse), some embodiments described herein operate using a duel data rate (DDR) scheme (i.e., data is sampled at the rising edge and at the falling edge of each clock pulse, meaning two bits of data are sampled with each clock pulse). In some embodiments, the input clock is the main system clock (not a DDR clock), and the input clock signal is converted to a DDR clock at the encoder 204.

In some embodiments, the encoder 204 also includes or is otherwise associated with a level shifter configured to upshift the voltage supply in order to manage the signal-to-noise ratio (SNR). For example, the level shifter shifts a 0.8V voltage supply (VDD) to a 1.2V voltage supply (VDDO). As such, the voltage swing is switched from 0V-to-0.8V to 0V-to-1.2V. Other voltage levels (e.g., lower or higher than 0.8V and lower or higher than 1.2V) may be implemented without departing from the scope of the inventive concepts described herein.

In some embodiments, the encoder 204 also includes a pre-driver, which is part of current management in the transmitter slice 402. Specifically, one or more drivers of the transmitter slice are driven by one or more pre-drivers, which are smaller in size than drivers.

The transmitter slice 402 implements the multi-level signaling scheme using one or more push-pull driver stages 406. In some embodiments, a push-pull driver stage includes a pull-up circuit and a pull-down circuit. An example pull-up circuit includes a PMOS transistor (depicted in FIG. 4 at MP1) and a resister (depicted in FIG. 4 as RP1) in series with the voltage supply (e.g., level shifted supply VDDO). Likewise, an example pull-down circuit includes an NMOS transistor (depicted in FIG. 4 at MN1) and a resister (depicted in FIG. 4 as RN1) in series with ground. Each transistor is controlled by an output of the encoder 204. For example, when encoder output Datp1 turns on MP1, the signal PAD0 is pulled up to VDDO through resistor RP1. Likewise, when encoder output Datn1 turns on MN1, the signal PAD0 is pulled down to ground through resistor RN1. While the disclosed pull-up and pull-down circuits are designed to optimize performance, other pull-up and pull-down circuit configurations may be implemented without departing from the scope of the inventive concepts described herein. Moreover, while the disclosed driver stages are designed to optimize performance, other driver stage configurations may be implemented without departing from the scope of the inventive concepts described herein.

Each transmitter slice includes at least one driver stage 406. One embodiment of transmitter slice 402 includes a single driver stage. When MN1 is on and MP1 is off, PAD0 is pulled down towards ground, and the channel conducts a low signal level (e.g., 0.25*VDDO), sometimes referred to as −1. When both MN1 an and MP1 are off, PAD0 maintains an intermediate state, and the channel conducts a medium signal level (e.g., 0.5*VDDO), sometimes referred to as 0. When MN1 is off and MP1 is on, PAD0 is pulled up towards VDD, and the channel conducts a high signal level (e.g., 0.75*VDDO).

In some embodiments, the storage medium 130 includes a termination circuit which receives the multi-level signal communicated over the channel 103. In some embodiments, the termination circuit is a push-pull driver. In some embodiments, the termination circuit includes a pull-up circuit and a pull-down circuit, similar to those described above. Further, pin capacitance is represented as capacitor Cpin. Embodiments of the multi-level signaling scheme described herein are implemented over a channel 103 (see FIGS. 1 and 2) connecting the transmitter slice (e.g., included in an interface implemented in an ASIC) with a receiver circuit (e.g., included in a NAND memory device separate from or otherwise independent of the ASIC). As such, the currently described embodiments account for impedance matching in order to minimize reflections of the multi-level signal from the receiver circuit back to the transmitter slice over the channel. The termination circuit is configured to match the impedance of the transmitter slice by, in part, turning on both pull-up and pull-down circuits (e.g., turning on transistors MPT and MNT).

The example interface system of FIG. 4 includes a single driver stage in the transmitter slice configured to signal three signal levels. However, in order to further optimize the transitions between those signal levels for performance, it may be desirable to add more driver stages as discussed below.

Figure 5:
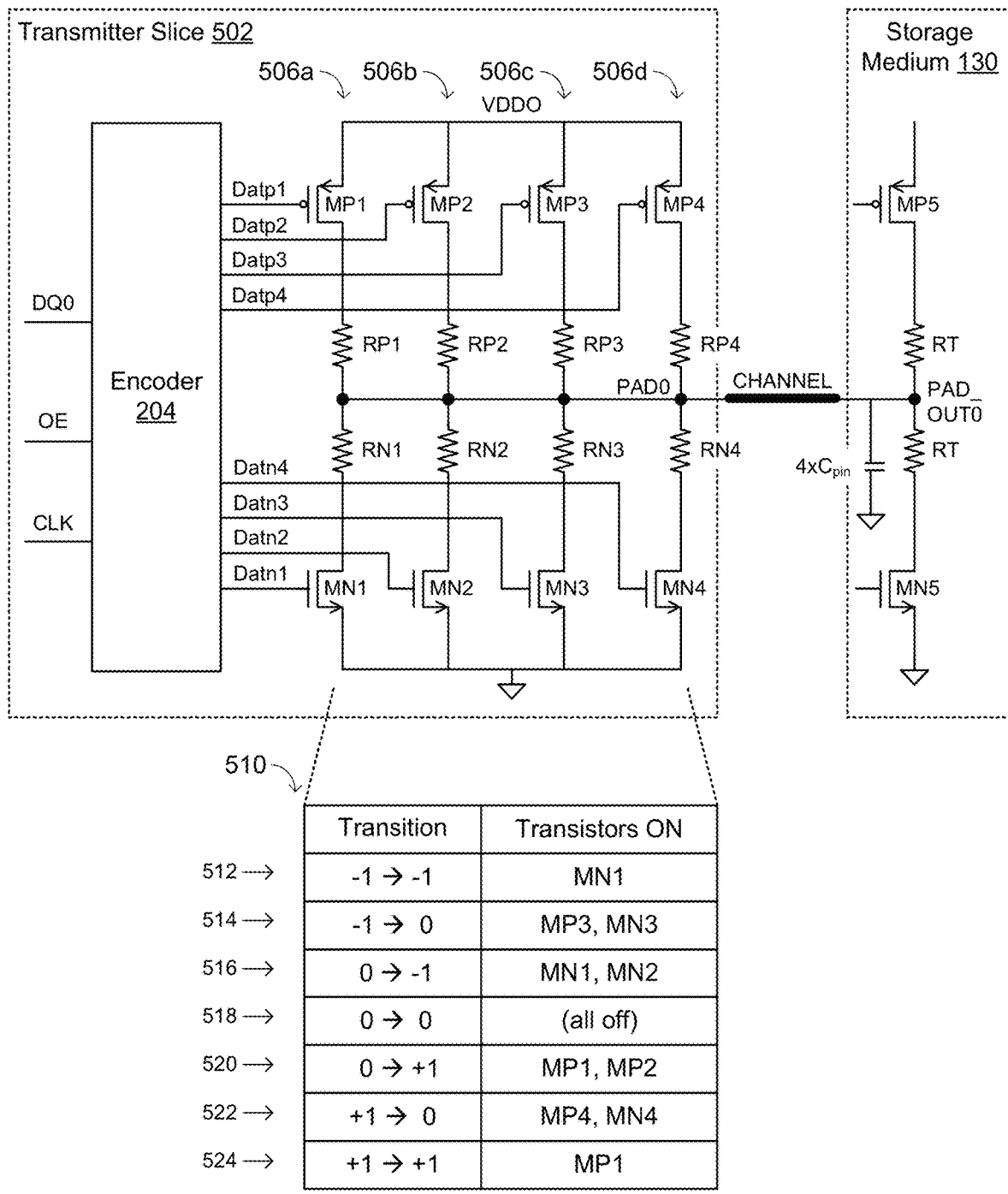
FIG. 5 is a block diagram of a transmitter slice with four driver stages in accordance with some embodiments.

FIG. 5 is a block diagram of an example transmitter slice 502 in accordance with some embodiments. Features shared with FIG. 4 are similarly numbered, and some are not further discussed for purposes of brevity. Transmitter slice 502 includes four driver stages 506a-d. Driver control table 510 specifies which transistors are turned on in order to communicate a multi-level signal over the channel in accordance with various transitions from a previous signal state to a current signal state (e.g., 0→+1 denotes a transition from a previous signal state 0 to a current signal state +1). For each transition, all transistors in the transmitter slice 502 not designated as being on in table 510 are off. For each state and for each transition between each state, however, it is important to note that the termination transistors (MP5 and MN5) are on.

The first driver stage 506a corresponds with driver stage 406 in FIG. 4. Further, rows 512, 518, and 524 of table 510 correspond with rows 412, 414, and 416 of table 410 (FIG. 4). Specifically, in order to transmit −1, or a transition from −1 to −1, MN1 is turned on, thereby pulling PAD0 down to a low level (e.g., 0.25*VDDO). In order to transmit a 0, or a transition from 0 to 0, all transistors are turned off, thereby keeping PAD0 at an intermediate level (e.g., 0.5*VDDO). In order to transmit a +1, or a transition from +1 to +1, MP1 is turned on, thereby pulling PAD0 up to a high level (e.g., 0.75*VDDO).

The second driver stage 506b is used for transitions from 0 to −1 and for transitions from 0 to +1 (rows 516 and 520 in table 510).

Specifically, in order to transmit a −1 when the previous state was 0, merely turning on MN1 may not cause the voltage at PAD0 to be pulled down quickly enough to reach the required level in the time permitted by the clock cycle. As the clock speeds up, there is less time to reach the required signal level for these types of transitions. Therefore, MN2 is also turned. When both MN1 and MN2 are on, current flows through two resistors in parallel (RN1 and RN2), rather than just one (RN1). As a result of the lower equivalent resistance, more current may flow to ground, thereby allowing the signal level to transition from the medium level (e.g., 0.5*VDDO) to the low level (e.g., 0.25*VDDO) more quickly.

Similarly, in order to transmit a +1 when the previous state was 0, merely turning on MP1 may not cause the voltage at PAD0 to be pulled up quickly enough to reach the required level in the time permitted by the clock cycle. As the clock speeds up, there is less time to reach the required signal level for these types of transitions. Therefore, MP2 is also turned. When both MP1 and MP2 are on, current flows through two resistors in parallel (RP1 and RP2), rather than just one (RP1). As a result of the lower equivalent resistance, more current may flow to VDDO, thereby allowing the signal level to transition from the medium level (e.g., 0.5*VDDO) to the high level (e.g., 0.75*VDDO) more quickly.

The third driver stage 506c may be used for transitions from −1 to 0 (row 514 in table 510), and the fourth driver stage 506d may be used for transitions from +1 to 0 (row 522 in table 510).

Specifically, in order to transmit a 0 when the previous state was −1, merely turning off all of the transistors may not cause the voltage at PAD0 to rise quickly enough to reach the required medium level in the time permitted by the clock cycle. Therefore, MP3 and MN3 are both turned on. The third driver stage 506c is configured to have a stronger pull-up circuit when compared to the pull-down circuit. In some embodiments, this configuration is achieved by setting RP3 lower than RN3. As a result, when both MP3 and MN3 are on, current flows through both RP3 and RN3, but it flows through RP3 more quickly, thereby causing the voltage at PAD0 to be pulled up. However, since MN3 is also on, the voltage will not reach the high level (e.g., 0.75*VDD0). Instead, the voltage reaches the required medium level (e.g., 0.5*VDDO), and it reaches this level more quickly due to the strong pull-up circuit.

Similarly, in order to transmit a 0 when the previous state was +1, merely turning off all of the transistors may not cause the voltage at PAD0 to fall quickly enough to reach the required medium level in the time permitted by the clock cycle. Therefore, MP4 and MN4 are both turned on. The fourth driver stage 506d is configured to have a stronger pull-down circuit when compared to the pull-up circuit. In some embodiments, this configuration is achieved by setting RN4 lower than RP4. As a result, when both MP4 and MN4 are on, current flows through both RP4 and RN4, but it flows through RN4 more quickly, thereby causing the voltage at PAD0 to be pulled down. However, since MP4 is also on, the voltage will not reach the low level (e.g., 0.25*VDDO). Instead, the voltage reaches the required medium level (e.g., 0.5*VDDO), and it reaches this level more quickly due to the strong pull-up circuit.

As described above, an optimal conversion rate between signal levels is desired in order to balance performance with power. Optimizing for performance, on the one hand, requires the conversion rate to be very fast in order to ensure that signal levels for transmission to a memory device are attained before they need to be transmitted and before the next signal level needs to be sampled (e.g., before the next clock edge). On the other hand, if the conversion rate between signal levels is too quick when compared to the clock signal, then there is the danger of medium levels being pulled too far to an extreme. For example, when transitioning from −1 to 0, if the conversion rate is too quick, there is a danger that the signal may be pulled past 0 and closer to +1. Similarly, when transitioning from +1 to 0, if the conversion rate is too quick, there is a danger that the signal may be pulled past 0 and closer to −1. Therefore, when encoding a transition between logic levels (versus a static logic level), different impedances are required. Stronger impedances are optimal for transitions (e.g., as described above with regard to stronger pull-up or pull-down circuits in the third and fourth driver stages, or as described above with regard to the second driver stage). Weaker impedances are optimal for static logic levels (e.g., as described above with regard to the first driver stage).

As described above, an optimal power scheme is attained by dynamically applying or foregoing application of impedance (e.g., by turning on and off the various transistors in order to activate or deactivate current paths through the resistors RP1-4 and/or RN1-4). For example, when transitioning from 0 to −1, MN1 and MN2 are both turned on until the signal reaches −1 (e.g., 0.25*VDDO) (see row 516 of table 510). Then, MN2 is turned off since it is no longer needed to charge the termination capacitance, leaving only MN1 turned on (see row 512 of table 510) to maintain the −1 level. By turning off MN2 and leaving only MN1, the resistance between PAD0 and ground is higher (due to current only flowing through RN1), and the lower current that results from the higher resistance saves power.

The example transmitter slice 502 includes four stages. However, other configurations including more than four stages or less than four stages may also be implemented without departing from the scope of the inventive concepts described herein. For instance, if optimizing for other conditions such as load or noise, or if performance is otherwise not an issue, one or more of the second through fourth driver stages may be eliminated, depending on which state transitions may be slowed down without missing clock sampling times.

In some embodiments, the resistor values of the various pull-up and pull-down circuits may be derived or otherwise optimized based on the maximum frequency of operation, equivalent load seen by the driver, and voltage values for the high, medium, and low logic levels (i.e., +1, 0, and −1). Assuming a balanced swing across the logic 0 level (e.g., 0.5*VDDO), the following mathematical relationships may be used to derive or otherwise optimize the resistor values for a transmitter slice with four driver stages:

1. $Rn1 = Rt * \left( \frac{VL}{VM - VL} \right)$

2. $Rp4 = Rn4 * \left( \frac{2 * VDDO}{VL + VM} - 1 \right)$

3. $Tbit = -(Rn1 \| Rn2 \| Rt) * Ceq * \ln \left[ \frac{VL - VM * \left( \frac{Rn1\|Rn2}{(Rn1\|Rn2) + Rt} \right)}{VM * \left( \frac{Rt}{(Rn1\|Rn2) + Rt} \right)} \right]$ 4. $Tbit = -(Rp4 \| Rn4 \| Rt) * Ceq * \ln \left[ \frac{VM - (Rp3\|Rn3\|Rt) * \left( \frac{VDDO}{Rp4} + \frac{VM}{Rt} \right)}{VH - (Rp3\|Rn3\|Rt) * \left( \frac{VDDO}{Rp4} + \frac{VM}{Rt} \right)} \right]$ 5. $Rp1 = Rn1; Rn3 = Rp4; Rp3 = Rn4; Tbit = \frac{1}{2} * Freq$ Where, Ceq=Equivalent load seen by the driver & Freq=Frequency of operation.

In some embodiments, example resistance values are as follows: RP1 and RN1 are about 100 Ohms, RP2 and RN2 are about 50 Ohms, RP3 and RN4 are about 30 Ohms, RN3 and RP4 are about 200 Ohms. Of course, other resistance values may be implemented without departing from the scope of the inventive concepts described herein.

Figure 6:
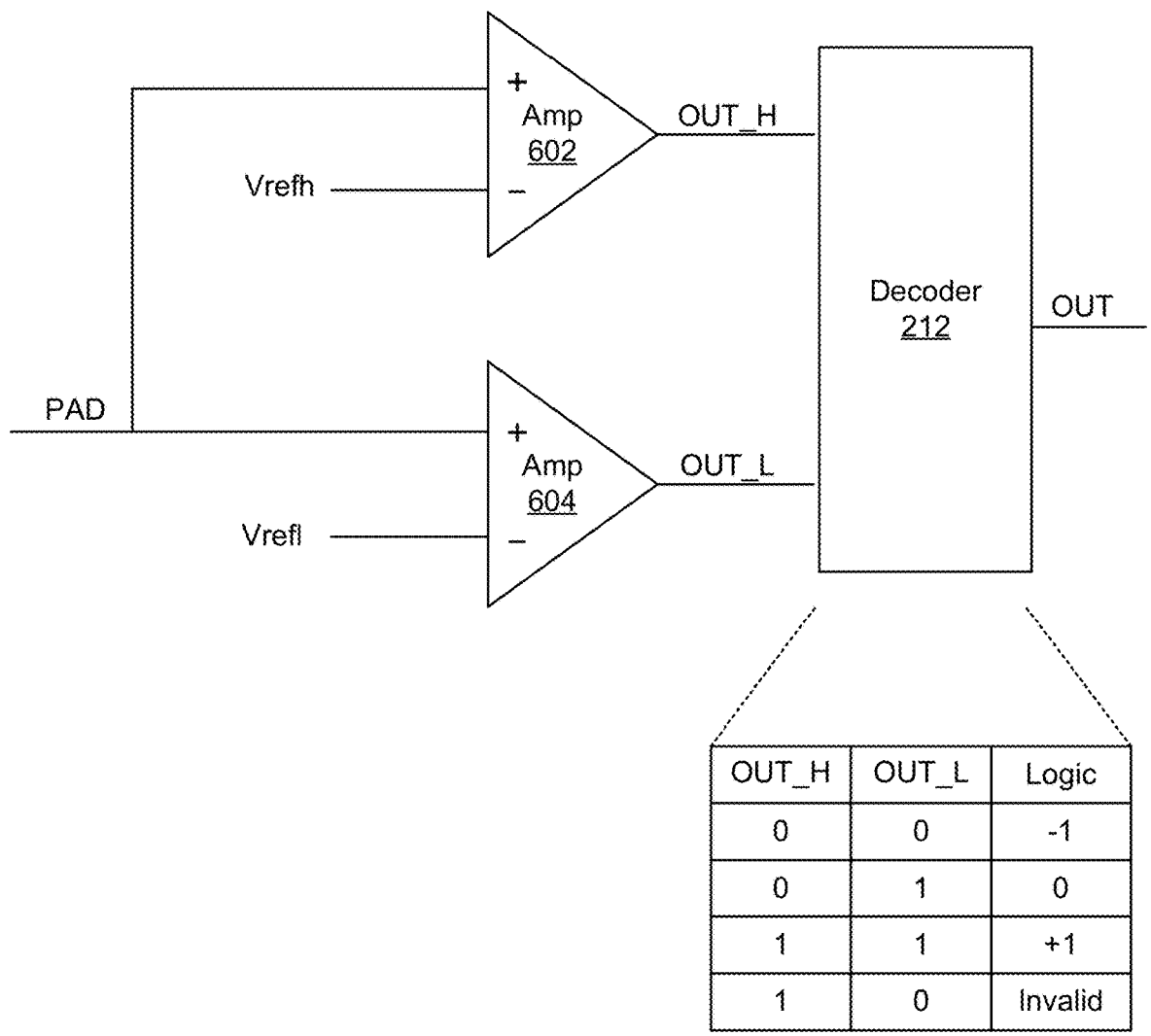
FIG. 6 is a block diagram of an example receiver slice of an interface system in accordance with some embodiments.

FIG. 6 is a block diagram of an example receiver slice 600 of an interface system 200 in accordance with some embodiments. Receiver slice 600 corresponds with receiver slice 210 (FIG. 2). Features shared with FIG. 2 are similarly numbered, and some are not further discussed for purposes of brevity. The input signal (designated as PAD) is compared to a high reference threshold at amplifier 602 and a lower reference threshold at amplifier 604. If the signal is lower than both thresholds (e.g., OUT H and OUT L are low), then the decoder 212 interprets the signal level as low (e.g., −1). If the signal is lower than the high threshold but higher than the low threshold, the decoder 212 interprets the signal level as medium (e.g., 0). If the signal is higher than both thresholds, then the decoder 212 interprets the signal level as high (e.g., +1). The decoder 212 decodes the multi-level signal to an output binary data signal, conveys the data to be written into the selectable portions of the storage medium 130. In some implementations, the decoder 212 also includes a level shifter configured to shift the voltage supply back to the level it was before the encoder 204 shifted it. In some implementations, the decoder 212 also includes additional logic for conditioning the output data before it is stored. In some embodiments, as described above with regard to transmitter slices, the data received by a single receiver slice represents one bit of a word to be written, and therefore, other receiver slices decode the other bits of the word in parallel.

Figure 7A:
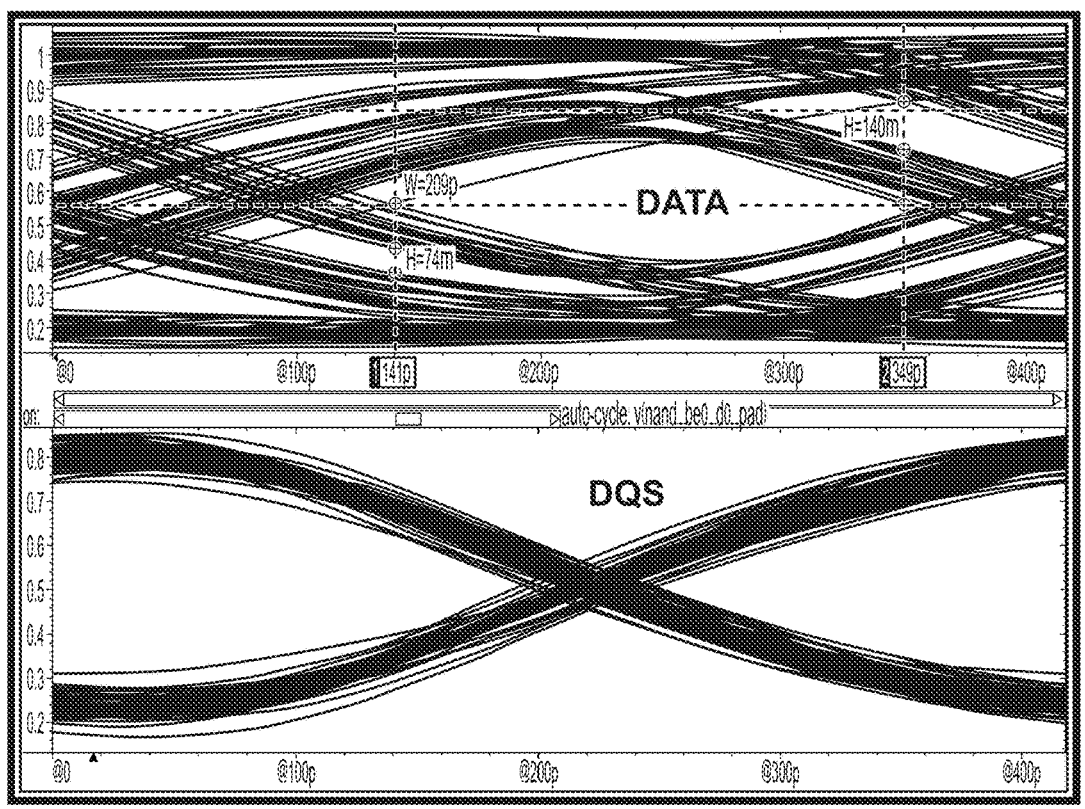
FIGS. 7A-7B are diagrams showing simulation results in accordance with some embodiments.
Figure 7B:
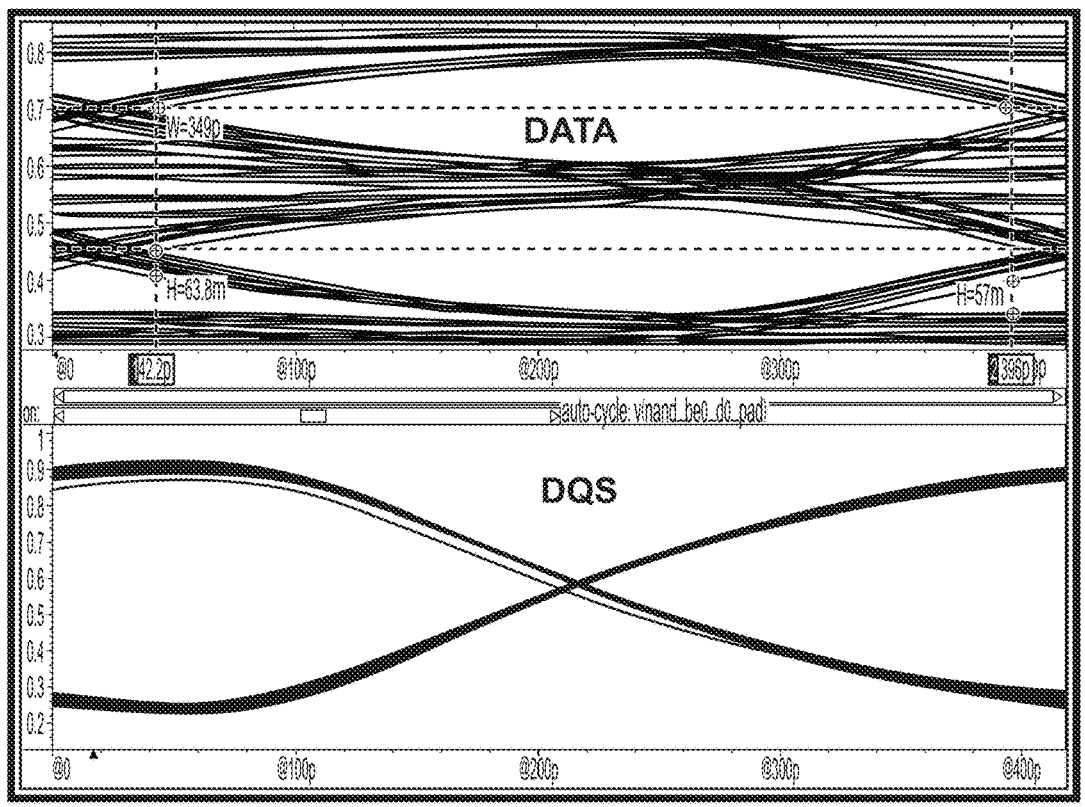

FIGS. 7A-7B are diagrams showing simulation results in accordance with some of the embodiments described above. FIG. 7A shows a snapshot of data at a conventional interface. The data is spread over two levels (high and low), and the clock signal (DQS) is relatively noisy. FIG. 7B shows a snapshot of data at an interface implementing the improved signaling techniques described herein. The data is spread over three levels (high, medium, and low), and the clock signal (DQS) is less noisy. In the simulation, the driver impedance increased from 30 to 60 Ohms (resulting in better pin capacitance characteristics), the eye width increased from 208 to 353 (resulting in higher performance), the eye height decreased from 340 to 180 my, the supply noise decreased from 110 to 90 mv, the peak and average currents decreased from 201 mA to 136 mA and from 103 mA to 77 mA, respectively (resulting in lower power), and the clock duty cycle distortion decreased from 3.6% to 1.0% (resulting in better performance).

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the terms "about" and "approximately" may refer to + or −10% of the value referenced. For example, "about 9" is understood to encompass 8.1 and 9.9.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A data storage system, comprising:
   a storage medium including a plurality of memory cells; and
   an interface coupled to the memory and a host, the interface comprising:
     a multi-level transmission encoder configured to receive an input data signal from the host and encode the input data signal as a multi-level data signal having at least three levels for subsequent transmission to the storage medium; and
     a multi-stage driver network including a plurality of driver stages, wherein each driver stage of the plurality of driver stages is configured to selectively apply an impedance to the multi-level data signal based on: (i) a current state of the multi-level data signal and (ii) a previous state of the multi-level data signal.

2. The data storage system of claim 1,
   wherein the multi-level data signal includes a low level, a medium level, and a high level; and
   a first of the plurality of driver stages includes a first pull-up circuit and a first pull-down circuit, wherein the encoder is configured to:
     turn on the first pull-up circuit in accordance with the previous state of the multi-level data signal being a high level and the current state of the multi-level data signal being a high level;
     turn off the first pull-up circuit and the first pull-down circuit in accordance with the previous state of the multi-level data signal being a medium level and the current state being a medium level; and
     turn on the first pull-down circuit in accordance with the previous state of the multi-level data signal being a low level and the current state of the multi-level data signal being a low level.

3. The data storage system of claim 2, wherein:
   a second of the plurality of driver stages includes a second pull-up circuit and a second pull-down circuit, wherein the encoder is configured to:

turn on the first and second pull-up circuits in accordance with the previous state of the multi-level data signal being a medium level and the current state of the multi-level data signal being a high level; and turn on the first and second pull-down circuits in accordance with the previous state of the multi-level data signal being a medium level and the current state of the multi-level data signal being a low level.

4. The data storage system of claim 3, wherein:
a third of the plurality of driver stages includes a third pull-up circuit and a third pull-down circuit; and
a fourth of the plurality of driver stages includes a fourth pull-up circuit and a fourth pull-down circuit; wherein the encoder is configured to:
turn on the third pull-up circuit and the third pull-down circuit in accordance with the previous state of the multi-level data signal being a low level and the current state of the multi-level data signal being a medium level; and
turn on the fourth pull-up circuit and the fourth pull-down circuit in accordance with the previous state of the multi-level data signal being a high level and the current state of the multi-level data signal being a medium level.

5. The data storage system of claim 4, wherein:
an impedance of the first pull-up circuit is about equal to an impedance of the first pull-down circuit;
an impedance of the third pull-down circuit is about equal to an impedance of the fourth pull-up circuit; and
an impedance of the third pull-up circuit is about equal to an impedance of the fourth pull-down circuit.

6. The data storage system of claim 5, wherein:
the first, second, third, and fourth pull-up circuits each comprise a PMOS transistor in combination with a resistor and a voltage signal higher than the high level of the multi-level data signal; and
the first, second, third, and fourth pull-down circuits each comprise an NMOS transistor in combination with a resistor and a voltage signal lower than the low level of the multi-level data signal.

7. The data storage system of claim 1, wherein the memory comprises:
a termination driver including a pull-up circuit and a pull-down circuit;
wherein the termination driver is configured to match an impedance of the multi-stage driver network.

8. The data storage system of claim 7, wherein the memory further comprises:
a multi-level transmission decoder configured to:
receive the multi-level data signal from the multi-stage driver network; and
decode the multi-level data signal as a binary data signal.

9. A method of storing data in a memory, the method comprising:
at an interface coupled to the memory and a host:
receiving an input data signal from the host;
encoding the input data signal as a multi-level data signal having at least three levels for subsequent transmission to the storage medium; and
applying, using a multi-stage driver network including a plurality of driver stages, an impedance to the multi-level data signal based on (i) a current state of the multi-level data signal and (ii) a previous state of the multi-level data signal.

10. The method of claim 9, wherein:
the multi-level data signal includes a low level, a medium level, and a high level; and
a first of the plurality of driver stages includes a first pull-up circuit and a first pull-down circuit; and
the method further comprises:
turning on the first pull-up circuit in accordance with the previous state of the multi-level data signal being a high level and the current state of the multi-level data signal being a high level;
turning off the first pull-up circuit and the first pull-down circuit in accordance with the previous state of the multi-level data signal being a medium level and the current state of the multi-level data signal being a medium level; and
turning on the first pull-down circuit in accordance with the previous state of the multi-level data signal being a low level and the current state of the multi-level data signal being a low level.

11. The method of claim 10, wherein:
a second of the plurality of driver stages includes a second pull-up circuit and a second pull-down circuit; and
the method further comprises:
turning on the first and second pull-up circuits in accordance with the previous state of the multi-level data signal being a medium level and the current state of the multi-level data signal being a high level; and
turning on the first and second pull-down circuits in accordance with the previous state of the multi-level data signal being a medium level and the current state of the multi-level data signal being a low level.

12. The method of claim 11, wherein:
a third of the plurality of driver stages includes a third pull-up circuit and a third pull-down circuit; and
a fourth of the plurality of driver stages includes a fourth pull-up circuit and a fourth pull-down circuit; and
the method further comprises:
turning on the third pull-up circuit and the third pull-down circuit in accordance with the previous state of the multi-level data signal being a low level and the current state of the multi-level data signal being a medium level; and
turning on the fourth pull-up circuit and the fourth pull-down circuit in accordance with the previous state of the multi-level data signal being a high level and the current state of the multi-level data signal being a medium level.

13. The method of claim 12, wherein:
an impedance of the first pull-up circuit is equal to an impedance of the first pull-down circuit;
an impedance of the third pull-down circuit is equal to an impedance of the fourth pull-up circuit; and
an impedance of the third pull-up circuit is equal to an impedance of the fourth pull-down circuit.

14. The method of claim 13, wherein:
the first, second, third, and fourth pull-up circuits each comprise a PMOS transistor in combination with a resistor and a voltage signal higher than the high level; and
the first, second, third, and fourth pull-down circuits each comprise an NMOS transistor in combination with a resistor and a voltage signal lower than the low level.

15. The method of claim 9, further comprising:
matching an impedance of the multi-stage driver network using, at the memory, a termination driver including a pull-up circuit and a pull-down circuit.

16. The method of claim 15, further comprising:
at the memory:
- receiving the multi-level data signal from the multi-stage driver network; and
- decoding the multi-level data signal as a binary data signal.

17. A data storage system, comprising:
a memory including a plurality of memory cells; and
an interface coupled to the memory and a host, the interface comprising:
- encoding means for receiving an input data signal from the host and encoding the input data signal as a multi-level data signal having at least three levels for subsequent transmission to the storage medium; and
- decoding means for:
  - receiving the multi-level data signal from the encoding means; and
  - decoding the multi-level data signal as a binary data signal.

18. The data storage system of claim 17, further comprising:
multi-stage driver network means including a plurality of driver stages for selectively applying an impedance to the multi-level data signal based on: (i) a current state of the multi-level data signal and (ii) a previous state of the multi-level data signal.

19. The data storage system of claim 18, further comprising:
a termination driver means including a pull-up circuit and a pull-down circuit for matching an impedance of the multi-stage driver network means.

20. The data storage system of claim 19, wherein the multi-level data signal includes a low level, a medium level, and a high level; and
a first of the plurality of driver stages includes a first pull-up circuit and a first pull-down circuit, wherein the encoder is configured to:
- turn on the first pull-up circuit in accordance with the current state of the multi-level data signal being a high level;
- turn off the first pull-up circuit and the first pull-down circuit in accordance with the current state of the multi-level data signal being a medium level; and
- turn on the first pull-down circuit in accordance with the current state of the multi-level data signal being a low level.

* * * * *